(12) United States Patent
Li et al.

(10) Patent No.: US 7,694,242 B1
(45) Date of Patent: Apr. 6, 2010

(54) SYSTEM AND METHOD OF REPLACING FLIP-FLOPS WITH PULSED LATCHES IN CIRCUIT DESIGNS

(75) Inventors: Hung-Chun Li, San Jose, CA (US); Ming-Chyuan Chen, San Jose, CA (US); KunMing Ho, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 381 days.

(21) Appl. No.: 11/609,304

(22) Filed: Dec. 11, 2006

(51) Int. Cl.
G06F 17/50 (2006.01)

(52) U.S. Cl. .................................. 716/1; 716/6; 716/18

(58) Field of Classification Search .................... 716/1, 716/6, 18
See application file for complete search history.

(56) References Cited

U.S. PATENT DOCUMENTS

| | | | | |
|---|---|---|---|---|
| 5,477,177 A * | 12/1995 | Wong et al. | ................. | 327/156 |
| 5,684,808 A * | 11/1997 | Valind | ................. | 714/726 |
| 6,446,249 B1 * | 9/2002 | Wang et al. | ................. | 716/17 |
| 6,457,161 B1 * | 9/2002 | Nadeau-Dostie et al. | ....... | 716/6 |
| 6,675,364 B1 * | 1/2004 | Basto et al. | ................. | 716/6 |
| 6,711,724 B2 * | 3/2004 | Yoshikawa | ................. | 716/6 |
| 6,911,854 B2 * | 6/2005 | Klass | ................. | 327/165 |
| 6,957,403 B2 * | 10/2005 | Wang et al. | ................. | 716/3 |
| 7,047,508 B2 * | 5/2006 | Chiu | ................. | 716/6 |
| 7,185,293 B1 * | 2/2007 | Ofer | ................. | 716/1 |
| 7,363,610 B2 * | 4/2008 | Alfieri | ................. | 716/18 |
| 7,411,413 B2 | 8/2008 | Shimazaki et al. | | |
| 7,428,720 B2 * | 9/2008 | Kanno et al. | ................. | 716/12 |
| 7,443,218 B2 * | 10/2008 | Onouchi et al. | ................. | 327/218 |
| 2004/0068640 A1 * | 4/2004 | Jacobson et al. | ................. | 712/220 |
| 2004/0190331 A1 * | 9/2004 | Ross et al. | ................. | 365/154 |
| 2008/0215941 A1 * | 9/2008 | Durham et al. | ................. | 714/726 |
| 2009/0024861 A1 | 1/2009 | Shimazaki et al. | | |

FOREIGN PATENT DOCUMENTS

JP 2004038917 2/1992

OTHER PUBLICATIONS

Shibatani et al.; "Pulse-latch approach reduces dynamic power"; EE Times—India; Aug. 2006; eetindia.com.*
Shibatani, S. ; Li, A. Pulse-latch approach reduces dynamic power. EE Times. Jul. 17, 2006. pp. 1-4.

* cited by examiner

*Primary Examiner*—Naum B Levin
(74) *Attorney, Agent, or Firm*—Alford Law Group, Inc.; William E. Alford; George Fountain

(57) ABSTRACT

A circuit design system, methodology, and software are disclosed for generating circuit capable of consuming less dynamic power. In particular, the circuit design methodology entails modifying an initial circuit design including a clock network coupled to a plurality of edge-triggered flip-flops to generate a modified circuit design that uses pulsed latches driven by pulse generators in place of at least some of the flip-flops. Since pulsed latches use less dynamic power than edge-triggered flip-flops, the modified circuit may consume less dynamic power. The circuit design methodology may further entail adding delay cells for balancing the clock network to compensate for timing effects caused by the insertion of pulse generators. Additionally, the methodology may further include cloning of forbidden clock paths to make more flip-flops eligible for pulsed latch replacement.

13 Claims, 14 Drawing Sheets

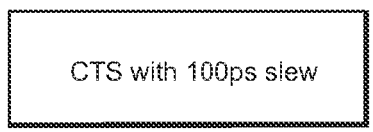 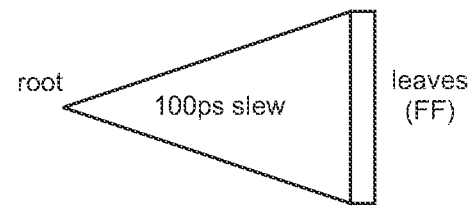
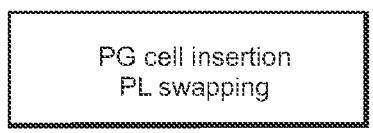 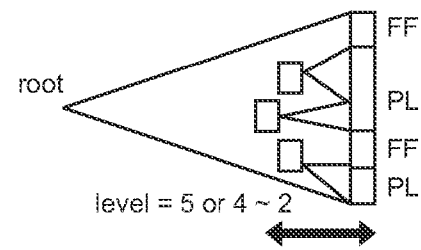
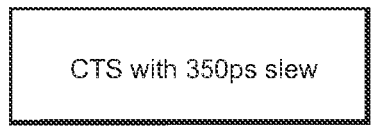 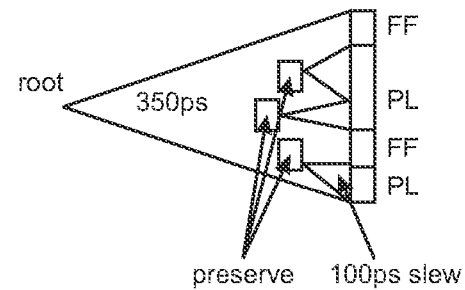
Fig. 8A

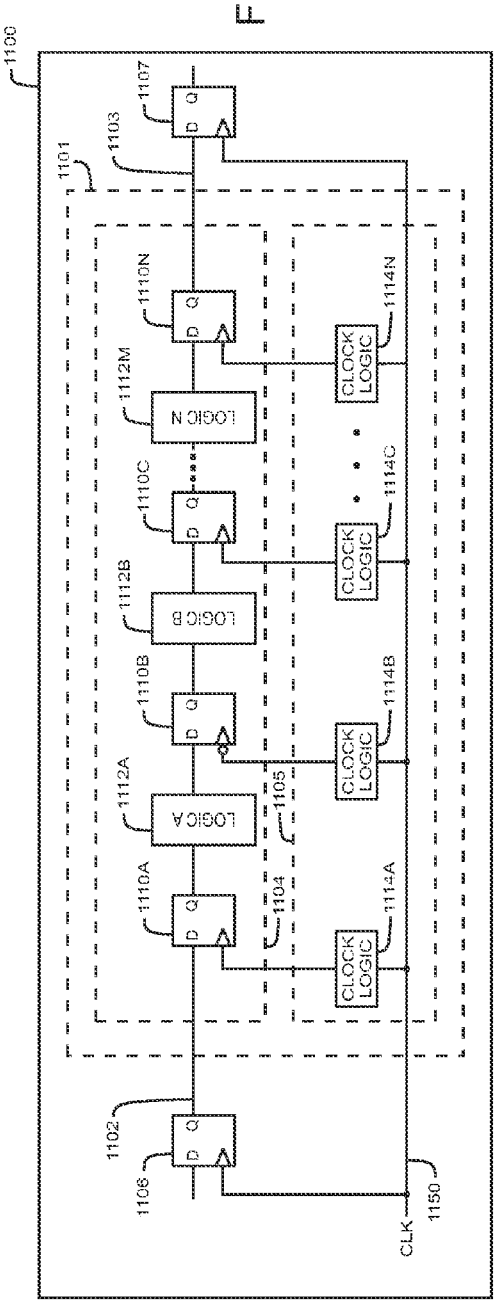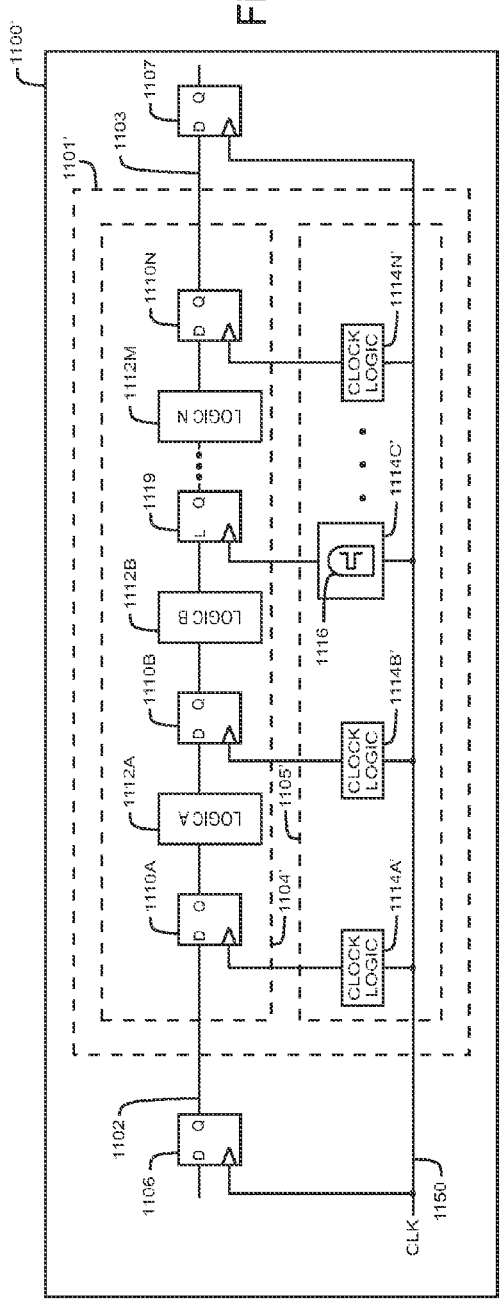

(BACKGROUND)

SYSTEM AND METHOD OF REPLACING FLIP-FLOPS WITH PULSED LATCHES IN CIRCUIT DESIGNS

FIELD OF THE INVENTION

The embodiments of the invention relate generally to circuit analysis, synthesis, and optimization. In particular, the embodiments of the invention relate to a system and method of replacing flip-flops with pulsed latches in circuit designs.

BACKGROUND OF THE INVENTION

Integrated circuits incorporating system-on-a-chip (SoC) technology integrate many distinct components into a single chip. Such components may include microcontrollers, microprocessors, digital signal processing (DSP) cores, memory blocks, and others. Each of these components may include a clock network to synchronize logic and control thereof.

Typically a plurality of edge-triggered flip-flops, such as master-slave D-type flip-flops, are used in the data paths of an integrated circuit triggered by a rising edge or a falling edge of a clock signal in the clock tree network. The plurality of edge-triggered flip-flops are typically used in integrated circuits to propagate data from a source element to one or more target elements. Generally, the propagation of data is performed synchronously with a periodic clock signal generated by a clock source. A clock tree network is typically employed to route the clock signal to the clock input of the flip-flops in a manner that delay, skew and slew are within the specification for the integrated circuit.

For each triggering edge of the periodic clock signal, the edge-triggered flip-flops propagate data from an input to an output. During the triggering edge of the clock signal, a large number of flip-flops may change state at substantially the same time so that a greater level of power may be consumed in order to effectuate the propagation and evaluation of data. This power is part of the dynamic power used by the integrated circuit. With wider data paths being used in integrated circuits, additional power may be consumed by the larger number of parallel flip flops used to make up each register therein. The clock tree network typically consumes a portion of the dynamic power in an integrated circuit. This is because the clock signals are typically periodically switched over a high level of capacitance in the clock wiring network by large clock buffers.

Generally, designers of integrated circuits are often developing techniques to reduce the dynamic power consumed by the clock network. Prior techniques developed for reducing the dynamic power of the clock network include using smaller clock buffers, reducing the overall wiring capacitance, clock gating to reduce the dynamic power at a particular instance, and using techniques, such as de-cloning, to move the clock buffers at higher levels of the clock hierarchical network. However, even with these techniques, the dynamic power of an integrated circuit can be further reduced.

One type of edge-triggered flip-flop is a D type flip-flop ("D flip-flop") that is triggered by a rising edge or falling edge of a clock signal. FIG. 12 illustrates an exemplary rising edge-triggered fully complimentary metal oxide semiconductor (CMOS) D type flip-flop 1200. The CMOS D flip-flop 1200 has a master portion including transfer gates formed of transistors 1210N and 1210P, transistors 1211N and 1211P, and inverters 1212A and 1212B; and a slave portion including transfer gates formed of transistors 1220N and 1220P, transistors 1221N and 1221P, and inverters 1222A and 1222B for a total of sixteen transistors. The eight transistors in the inverters 1212A and 1212B, and 1222A and 1222B in the D flip-flop 1200 are active and consume power. The inverter 1203 that inverts the clock signal CLK may be used by the D flip-flop as well as a latch and may be external to each so it is shared by other circuits and is therefore not counted.

A latch in comparison to a D flip-flop consumes less dynamic power as it has fewer transistors to switch. An inverting fully complementary metal oxide semiconductor (CMOS) latch has a total of eight transistors, four of which are active to consume power. Thus, an inverting CMOS latch may consume half of the power of a CMOS D flip-flop. Additionally, a CMOS latch may use less silicon area than a CMOS D flip-flop. Accordingly, an integrated circuit that uses latches in place of some of its flip-flops can consume less power. However, there are design issues with replacing an edge-triggered flip-flop with a latch. A circuit design system that assists a designer in properly implementing a replacement of at least some of the edge-triggered flip-flops in a circuit design with latches would be of substantial value.

BRIEF DESCRIPTION OF THE DRAWINGS

FIGS. 8A-8B are diagrams illustrating a couple of exemplary manners of modeling lower level clock paths in accordance with another embodiment of the invention;

FIG. 11A illustrates an exemplary initial circuit design that may be input into the clock tree synthesizer for flip-flop replacement or substitution by pulsed latches in accordance with embodiments of the invention;

FIG. 11B illustrates an exemplary modified circuit design associated with FIG. 11A that may be output by the clock tree synthesizer after performing flip-flop replacement or substitution by pulsed latches in accordance with embodiments of the invention.

DETAILED DESCRIPTION OF THE EXEMPLARY EMBODIMENTS

Figure 1A:
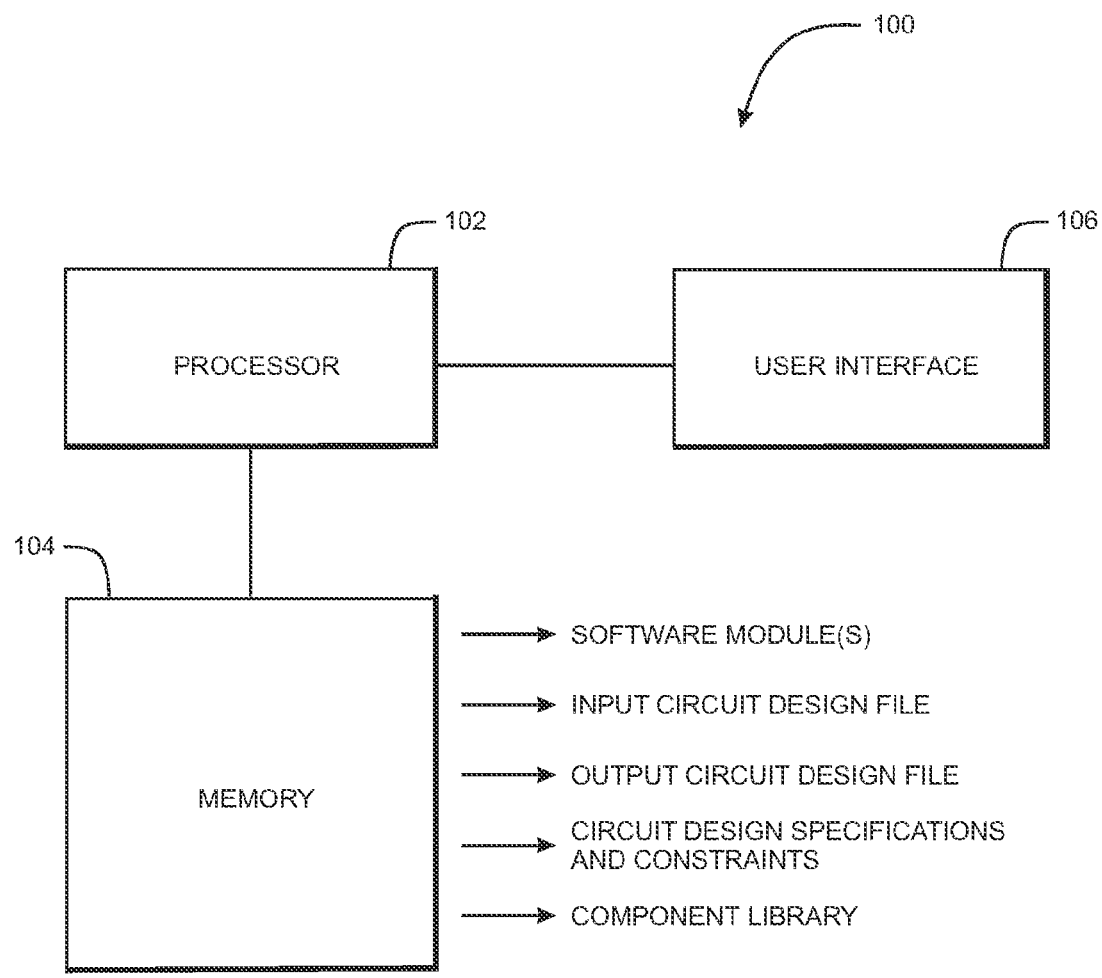
FIG. 1A illustrates a block diagram of an exemplary circuit design system in accordance with an embodiment of the invention.

An aspect of the invention relates to a circuit design system, methodology, and corresponding software for modifying an initial circuit design including a clock network with a plurality of edge-triggered flip-flops to generate a modified circuit design that uses pulsed latches driven by pulse generators in place of at least some of the flip-flops. Since, as discussed above, pulsed latches use significantly less dynamic power than edge-triggered flip-flops, the modified circuit may consume substantially less dynamic power. The circuit design system, methodology, and software provide for the automatic synthesis of the new circuit design in accordance with a specification provided by a user.

In particular, a method of designing a circuit in a circuit design system is provided herein. The method comprises receiving or generating a circuit design comprising a clock network coupled to a plurality of edge-triggered flip-flops; modifying the circuit design to replace the selected flip-flops with respective pulsed latches; and modifying the clock network to add pulsed generators for the pulsed latches. The method may further comprise modifying the clock network to further add delay cells to compensate for timing effects on the clock network caused by the added pulse generators.

The circuit design methodology may further include identifying the selected flip-flops for pulsed latch replacement. This may entail receiving a specification from a user identifying forbidden flip-flops that are not eligible for pulsed latch replacement, and identifying flip-flops that are not identified as forbidden flip-flops as the selected flip-flops for pulsed latch replacement. In identifying the selected flip-flops for pulsed latch replacement, the method may further comprise modifying the circuit design so that certain forbidden flip-flops can be made eligible for the pulsed latch replacement, and identifying those flip-flops as selected flip-flops for pulsed latch replacement. In this regard, the circuit design may be modified by cloning forbidden clock paths, and modifying the circuit design so that the selected forbidden flip-flops are connected to the cloned clock paths instead of the forbidden clock paths.

The circuit design methodology may further comprise modifying the circuit design to optimize the skew and slew parameters of clock paths including the pulsed generators. The method may further comprise modifying the circuit design to provide an upper clock tree that provides a clock signal in accordance with a slew specification to each of the pulse generator root clock paths. In this regard, one implementation is to design the upper clock tree while treating the inputs to the pulse generators as preserve inputs. In another implementation, macro models are generated for the pulse generators and their corresponding clock paths, and the upper cock tree is designed using the macro models.

Additionally, according to the circuit design methodology, the performance parameters (e.g., skew, slew, timing, and power) of the modified circuit design and the initial circuit design are reported to the user to allow the user to modify the parameters for trade-off analysis purposes. The modified circuit design is further checked for compliance with pulsed latch design rules. Such rules may include the clock network worst-case slew is within minimum and maximum limits; prohibition of multiple pulse generators or multiple delay cells in the same clock path; no performing pulsed latch swapping of forbidden flip-flops; and prohibiting pulsed latches not driven by pulse generators.

The circuit design system and corresponding software disclosed herein implements the circuit design methodology discussed above. Other aspects, advantages and novel features of the present invention will become apparent from the following detailed description of the invention when considered in conjunction with the accompanying drawings.

Referring now to the Figures, FIG. 1A illustrates a block diagram of an exemplary circuit design system 100 in accordance with an embodiment of the invention. As discussed in more detail further, the circuit design system 100 is capable of receiving an initial circuit design including a clock tree network coupled to a plurality of edge-triggered flip-flops, and modifying the circuit design to replace at least some of the flip-flops with pulsed latches with modifications to the clock tree network. As discussed above, a latch consumes substantially less power than an edge-triggered flip-flop. Accordingly, with the circuit design system 100, replacing flip-flops with pulsed lathes to form the modified circuit design, products incorporating the modified circuit design may have reduced power consumption.

As discussed in more detail below, the circuit design system 100 is capable of (1) analyzing the initial circuit design to identify flip-flops who are candidates for replacing with pulsed latches; (2) modifying the initial circuit design to clone forbidden clock paths in order to increase the number of candidate flip-flops; (3) further modifying the initial circuit design to replace the candidate flip-flops with pulsed latches; (4) further modifying the initial circuit design to add pulse generators for generating the proper triggering pulse for the pulsed latches in response to the clock signal; (5) further modifying the initial circuit design file to add delay cells to compensate for timing effects caused by the added pulse generators; (6) further modifying the initial circuit design file to perform further slew-sensitive clock tree synthesis to control the slew requirement across the clock network; (7) generating comparison reports of skew, slew, and power performance for the initial circuit design and the modified circuit design to assess trade-offs; and (8) checking the modified circuit design for compliance with pulsed latch design rules.

In particular, the circuit design system 100 may be any computing device, such as a computer, including a processor 102, a memory 104, and a user interface 106. The processor 102 performs the various operations of the circuit design system as summarized above and detailed below. The memory 104 may be one or more types of computer readable medium, such as RAM, ROM, magnetic disk, optical disc, etc, storing one or more software module(s) adapted to control the processor 102 in performing its operation. Additionally, the memory 104 stores various types of data, such as the initial circuit design, modified circuit design, circuit design specification, component library, and other information. The user interface 106 may be one or more types of any user interface device, such as a keyboard, pointer device, display, etc., that allows a user to provide and receive information to and from the processor 102 for performing the circuit design analysis, synthesis, and optimization described herein.

The following further describes the circuit design analysis, synthesis, and optimization methodology that may be performed by the circuit design system 100.

Figure 1B:
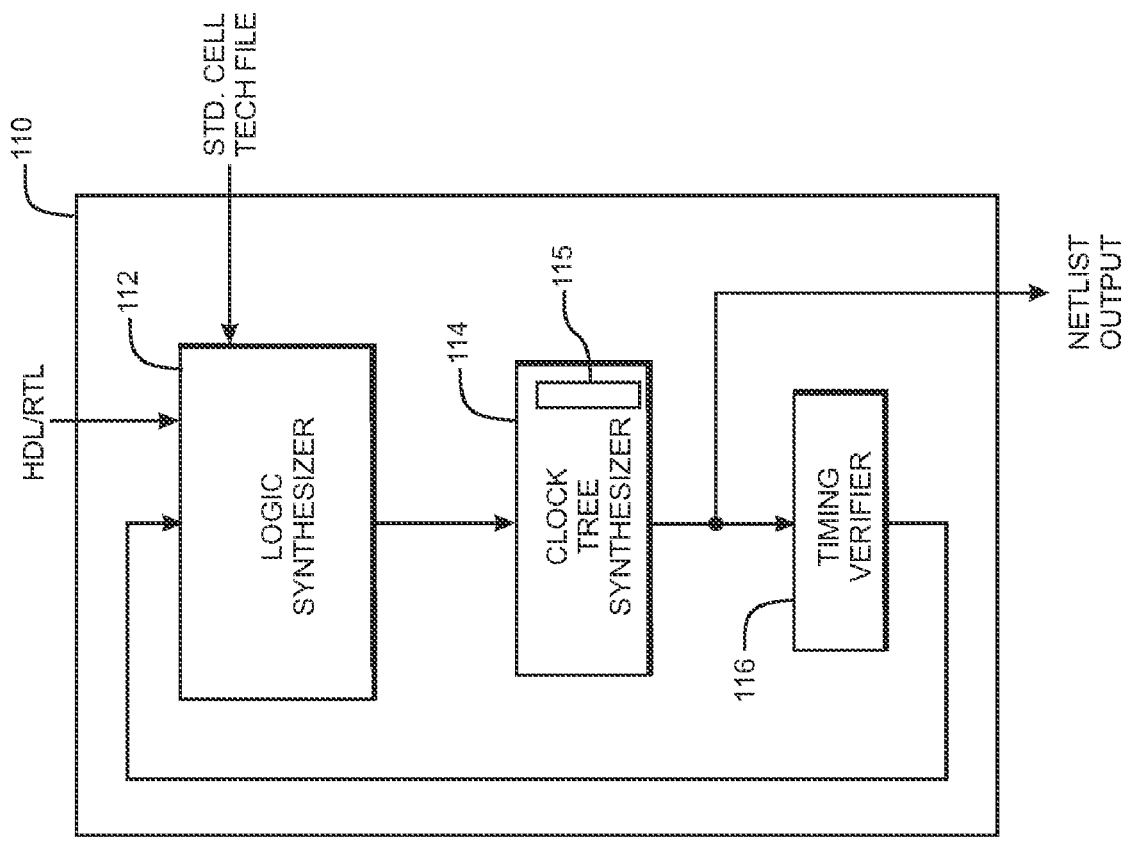
FIG. 1B illustrates a block diagram of a synthesis software tool for operation with the circuit design system of FIG. 1A in accordance with another embodiment of the invention.

Referring now to FIG. 1B, a synthesis software tool 110 is illustrated including a logic synthesizer module 112, a clock tree synthesizer module 114, and a timing verifier 116. The clock tree synthesizer module 114 includes a flip-flop replacement module 115 to replace or substitute candidate flip-flops with pulsed latches.

The logic synthesizer module 112 receives a high-level description language (HDL) or register transfer level (RTL) circuit description and a standard cell technology file from which functional logic can be generated by the logic synthesizer 112 including a plurality of flip-flops of data paths of an integrated circuit.

The clock tree synthesizer 114 generates clock tree paths in the integrated circuit from a clock source to the clock inputs of the plurality of flip-flops in the data paths. As discussed previously, the flip-flop replacement module 115 replaces or substitutes candidate flip-flops with pulsed latches. Additionally, the flip-flop replacement module 115 inserts a pulse generator at selective levels in the clock tree paths between the clock source and the clock input of the pulsed latches. The flip-flop replacement module 115 of the clock tree synthesizer 114 may further insert delay cells to compensate for delay effects caused by the added pulse generators. For instance, the flip-flop replacement module 115 may insert delay cells in other clock tree paths that do not couple to a pulsed latch or are otherwise without an inserted pulse generator at a level parallel with an inserted pulse generator.

The timing verifier 116 receives a netlist including data paths and clock tree paths of the integrated circuit to verify that timing specifications are met with the given logical design of the integrated circuit. After the flip-flop replacement module 115 replaces or substitutes candidate flip-flops with pulsed latches, the timing verifier 116 verifies that the timing specifications of the logic design are met once again to output a netlist of a modified integrated circuit.

Figures 10A, 10B:
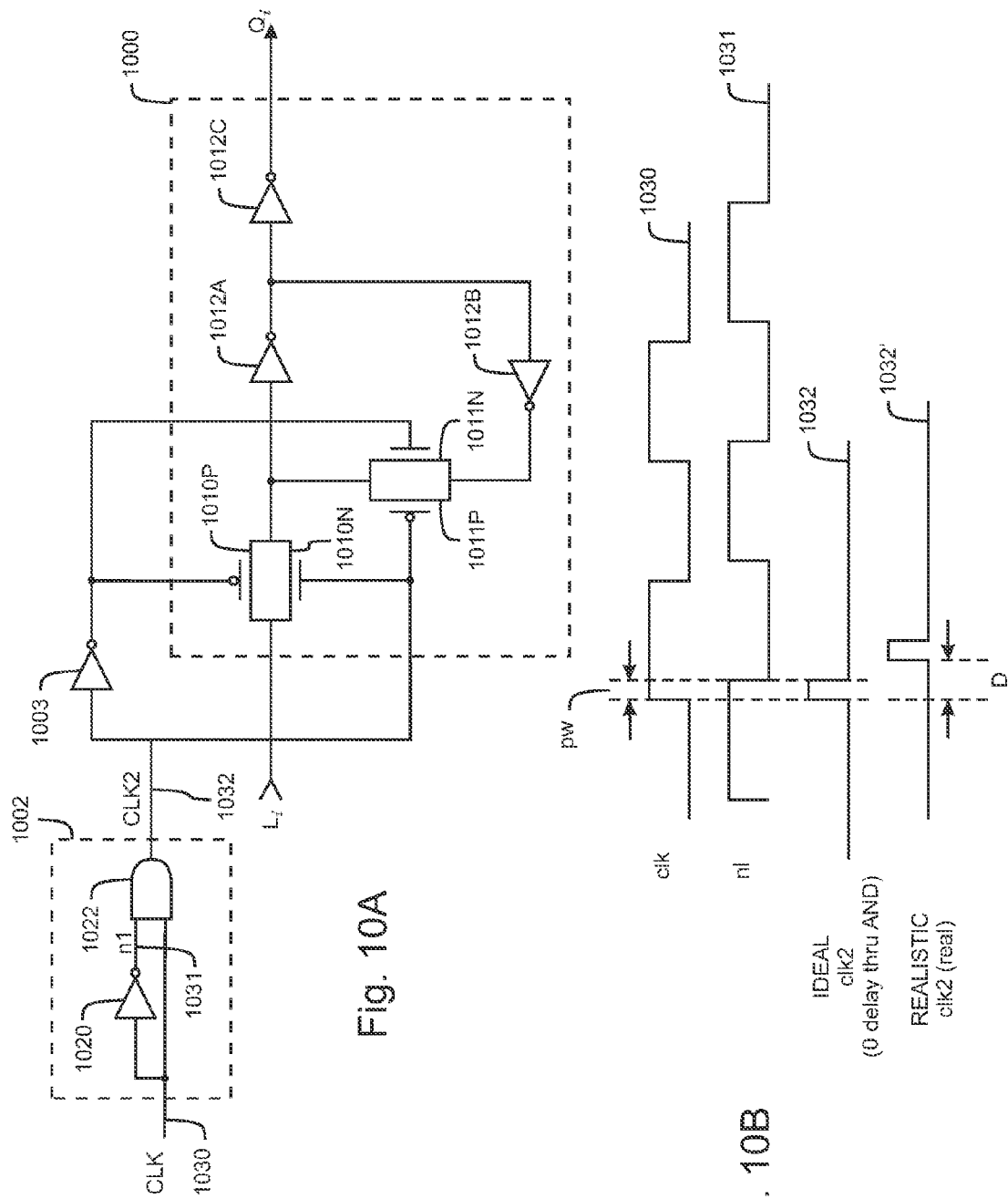
FIG. 10A illustrates a schematic diagram of an exemplary pulsed latch and pulse generator that may be used to modify the initial circuit design into the modified circuit design to conserve power in accordance with embodiments of the invention.
FIG. 10B illustrates an exemplary timing diagram of signal waveforms generated in the pulse generator schematically illustrated in FIG. 10A.
Figure 12:
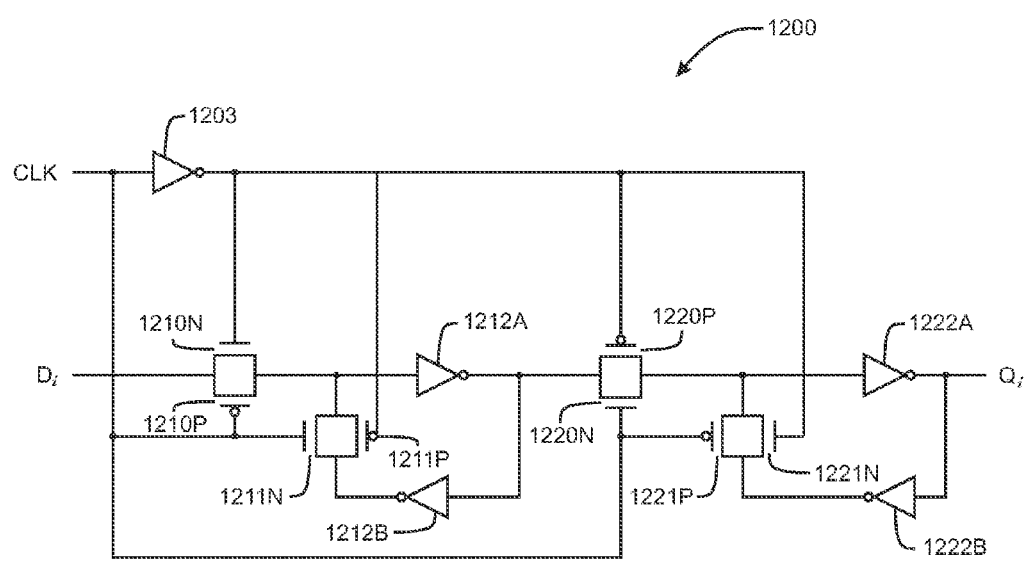
FIG. 12 illustrates a schematic diagram of an exemplary rising edge triggered CMOS D-type flip-flop.

Referring now to FIG. 10A, an exemplary schematic diagram is illustrated of a non-inverting pulsed latch 1000 and a pulse generator 1002 that may be used in embodiments of the invention. FIG. 10B illustrates an exemplary timing diagram of signal waveforms associated with the pulse generator 1002.

The non-inverting pulsed latch 1000 includes a pair of fully complementary transfer gates formed by transistors 1010N and 1010P, and 1011N and 1011P; and inverters 1012A–1012C coupled together as shown. Pulsed latches 1000 require pulse generators 1002 to generate a pulse clock CLK2 waveform from a source clock CLK.

The pulse generator 1002 includes one or an odd number of inverters 1020 coupled in series together, and a logical AND gate 1022 to generate the pulsed clock CLK2 1032 at its output. The inverter 1003 may be part of the pulse generator 1002 or it may be included in the pulsed latch 1000 if the pair of fully complementary CMOS transfer gates are used in the pulsed latch.

The clock source CLK 1030 is coupled into the odd number of one or more serial inverters 1020. The odd number of serial inverters 1020 generates a delayed inverted clock signal on node n1 1031 as illustrated by the waveform 1031 in FIG. 10B. The clock source CLK 1030 and the inverted clock signal 1031 are coupled into the AND gate 1022 and logically ANDed together. The delay in the inverted clock signal on node n1 1031 from that of the clock source CLK 1030 provides an overlap in high logic levels such that the AND gate 1022 generates a pulse each time in the pulsed clock CLK2 as indicated by the waveform 1032 and 1032'. Under ideal conditions there would be no delay in the AND gate 1022 in the pulse generator 1002 such that the ideal pulsed CLK2 waveform 1032 would be generated. However, in reality there is a delay D in the generation of the pulses in the pulsed clock CLK2 as illustrated by the realistic pulsed CLK2 waveform 1032'.

The pulse width PW in the pulsed clock CLK2 waveform is selected by the number odd numbered inverters 1020 that are coupled in series together such that it facilitates the replacement of flip-flops by the pulsed latch 1000.

The latch 1000 can capture data at its data input Li during the sensitive time that is determined by the pulse width PW of the pulses in the pulsed clock CLK2 waveform. If the pulsed clock CLK2 waveform triggers the latch 1000, the latch 1000 is synchronized with the clock CLK 1030 similar to an edge triggered flip-flop since the rising and the falling edges of pulsed clock CLK2 are almost identical in terms of timing. Therefore, the characterization of the setup times of the pulsed latch 1000 are expressed with respect to the rising edge of the pulsed clock CLK2, and the hold times of the pulsed latch 1000 are expressed with respect to the falling edge of pulsed clock CLK2. That is, the representation of timing models of the pulsed latches 1000 is similar to that of edge triggered flip-flops.

To replace a register comprising a plurality of flip-flops, a plurality of the pulsed latches can be instantiated in parallel together with each latch input Li coupled to the respective bits of the input data bus and each latch output Qi coupled to the respective bits of the output data bus. The non-inverting pulsed latch 1000 can be converted to an inverting pulsed latch to further reduce the number of transistors and further conserve power by the elimination of inverter 1112C. To further reduce the number of transistors and conserve power, the transfer gates in the pulsed latch may be modified to eliminate one transistor each so they are not fully complementary transfer gates and the active inverter 1003 may be eliminated as well. For example, transistors 1010P and 1011N may be eliminated from the pulsed latch 1000.

Referring now to FIG. 11A, an exemplary initial circuit design 1100 is illustrated that may be input into the clock tree synthesizer for flip flop replacement or substitution by pulsed latches in accordance with embodiments of the invention. The initial circuit design 1100 includes a functional module 1101 having a data path network 1104 and a clock tree network 1105.

The data path network 1104 includes a plurality of flip-flops/registers 1110A-1110N. and one or more functional logic blocks 1112A-1112M respectively between the plurality of flip flops/registers 1110A-1110N. The flip-flops/registers 1110A and 1110N are interface flip-flops/registers respectively coupled to flip-flops/registers 1106 and 1107. Thus, the flip-flops/registers 1110A and 1110N in the data path network 1104 may not to be substituted for pulsed latches in accordance with constraints specified in a specification.

One or more of the flip-flops/registers in the data path network may be positive edge triggered with respect to the clock root source 1150, such as flip-flop/registers 1110A, 1110C, and 1110N. One or more of the flip-flops may be negative edge triggered with respect to the clock root source 1150, such as flip-flop/register 1110B. If positive edge triggered flip-flops/registers are the target flip-flops/registers to replace with pulsed latches, then the negative edge triggered flip-flops/registers may not be replaced with pulsed latches in accordance with the constraints in the specification. If negative edge triggered flip-flops/registers are the target flip-flops/registers to replace with pulsed latches, then the positive edge triggered flip-flops/registers may not be replaced with pulsed latches in accordance with constraints in the specification.

The clock tree network 1105 includes clock logic 1114A-1114N coupled between the clock root source 1150 and the clock inputs of the plurality of flip-flops/registers 1110A-1110N. The clock logic may couple to a negative edge triggered or a positive edge triggered flip-flop/register. If coupled to positive edge triggered flip-flops/registers that are the target flip-flops/registers to replace with pulsed latches, then the clock logic coupled thereto may be modified to include a pulse generator. If coupled to negative edge triggered flip-flops/registers that are the target flip-flops/registers to replace with pulsed latches, then the clock logic coupled thereto may be modified to include a pulse generator.

Referring now to FIG. 11B, an exemplary modified circuit design 1100' associated with FIG. 11A is illustrated that may be output by the clock tree synthesizer after performing flip flop replacement or substitution by pulsed latches in accordance with embodiments of the invention. For example, the flip-flop/register 1110C in FIG. 11A is replaced by a pulsed latch 1119 as illustrated in the modified data path network 1104' of the functional block 1101' illustrated in FIG. 11B.

The clock tree network 1105' is modified in accordance with the replacement/substitution of flip-flops/registers with pulsed latches in the modified circuit design 1100'. For example, the clock logic 1114C' is modified to include a pulse generator 1116. The other clock logic blocks, such as clock logic 1114A'-1114B' and 1114D'-1114N', may be modified to compensate for the insertion of the pulse generator 1116 in clock logic 1114C'. For example, a delay element may be added to each. While FIG. 11B illustrates one functional module 1101' that is modified by replacing flip-flops/registers with pulsed latches, additional functional modules in the integrated circuit design may be modified.

Figure 2:
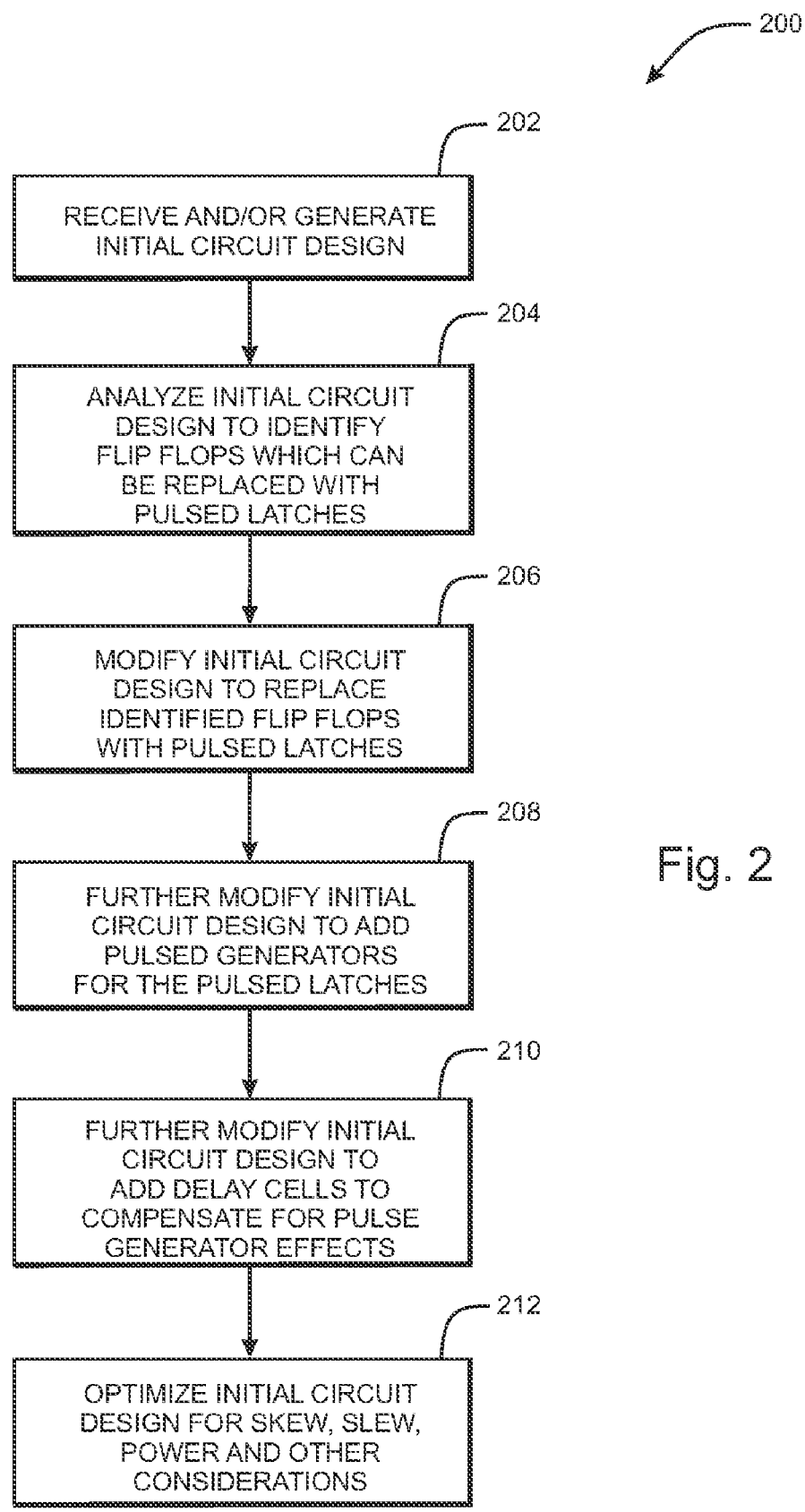
FIG. 2 illustrates a flow chart of an exemplary method of modifying a circuit design to replace edge-triggered flip-flops with pulsed latches in accordance with another embodiment of the invention.

Referring now to FIG. 2, a flow chart is illustrated of an exemplary method 200 of modifying an initial circuit design to replace edge-triggered flip-flops with pulsed latches in accordance with embodiments of the invention. According to the method 200, the processor 102 may receive and/or generate an initial circuit design with the assistance of a user using the user interface 106 (block 202). The initial circuit design may be specified in register transfer logic (RTL) or any hardware description language (HDL). In this case, the initial circuit design describes a circuit including a clock network coupled to a plurality of edge-triggered flip-flops. The initial circuit design file may further include a design specification for the modified circuit design. Such specification may include slew, skew, power consumption, timing, and other design criteria. One particular criteria of interest is the identity of certain flip-flops and corresponding clock paths in the clock network of the initial circuit design file that cannot undergo pulsed latch replacement.

Then, according to the method 200, the processor 102 analyzes the initial circuit design to determine which edge-triggered flip-flops are candidates for pulsed latch replacement (block 204). As discussed above, the initial circuit design may have certain flip-flops and corresponding clock paths that are forbidden to undergo the pulsed latch replacement. Some examples include flip-flops that are connected to primary ports for timing model generation (e.g., flip flops in the interface registers), flip-flops that transition on a clock edge different than the triggering clock edge of replaceable flip flops coupled to the same branch of clock tree network, and flip-flops that are connected to forbidden clock paths at specified lower levels. That is, logical instances of exceptions to pulse latch replacement are marked by the clock tree synthesis software.

The clock tree synthesis software marks flip flops in the netlist that are not to be swapped as "dontSwap", such as the flip flops in the interface registers of functional blocks. The clock tree synthesis software additionally marks logic instances in the netlist that are forbidden from being swapped, such as macro-cells and latches in the netlist. In an alternate embodiment of the invention, the flip flops and registers of the initial circuit design are tabulated in a table and the dontSwap flip-flops/registers and the forbidden logic in the table are marked off so as not to be analyzed and replaced by pulsed latches.

The clock tree synthesis software traces the clock network between the clock generator that generates the clock root signal and the plurality of edge triggered flip flops in the netlist. The clock tree synthesis software does a forward trace from the clock root to the plurality of edge triggered flip flops to a count of the clock buffer depths. The clock tree synthesis software further does a back ward trace from the register or flip flop clock pin back to the clock root to determine a count of the clock buffer levels within a portion of the clock tree network. Clock buffer levels are used from higher to lower to analyze the clock tree at the various levels. The clock buffer levels may also be used to specify portions of the clock tree network that are suitable for cloning and the positions of clock buffer levels where insertion of pulse generators and delay cells may be made. It is desirable to share pulse generators with a plurality of pulsed latches to conserver further power by inserting pulse generators at a higher level in the clock tree network of a functional logic block.

As discussed in more detail below with reference to FIG. 4, the processor 102 may modify the initial circuit design to increase the number of candidate flip-flops to undergo pulsed latch replacement. In particular, flip-flops that would otherwise be candidates but are connected to specified lower levels of forbidden clock paths may be made candidate flip-flops by cloning at least a portion of the forbidden clock paths for these flip-flops, thereby eliminating their connection to the forbidden clock paths. The clock tree synthesis software clones forbidden clock tree paths at specific clock buffer levels to generate additional flip flop replacement candidates.

Once the processor 102 has identified the candidate flip-flops, the processor modifies the initial circuit design to replace the candidate flip-flops with respective pulsed latches (block 206). A register having a plurality of flip flops instantiated in parallel together are respectively replaced with a plurality of pulsed latches instantiated in parallel together. The plurality of pulsed latches may be clocked by the same pulse generator.

The processor 102 further modifies the initial circuit design to add a pulse generator at specific clock buffer levels in the clock paths that couple to each of the one or more pulsed latches (block 208). However, note that one pulse generator may be shared by a plurality of pulsed latches such as in the case of a plurality of flip flops in a register that have been replaced by a plurality of pulsed latches. The clock tree synthesis software inserts a pulse generator at specific clock buffer levels to generate a pulse for the one or more pulsed latches coupled to the given clock path. Note that there may be parallel clock paths that are coupled to forbidden registers or flip-flops that do not have a pulse generator added at the specific clock buffer levels.

The processor 102 then further modifies the initial circuit design at specific clock buffer levels to add delay cells to parallel clock paths that do not have an inserted pulse generator at that level in order to balance out the clock paths from timing imbalances that may be caused by the added pulse generators (block 210).

Then, the processor 102 optimizes the circuit design in order to ensure that the overall skew, slew, power and other requirements are within specifications (block 212). For example, a clock buffer may be replaced by a pulse buffer and a clock inverter may be replaced by a pulse inverter.

As discussed above, since the modified circuit design includes pulsed latches in place of at least some of the edge-triggered flip-flops, products incorporating the modified circuit design may consume less dynamic power.

Figure 3:
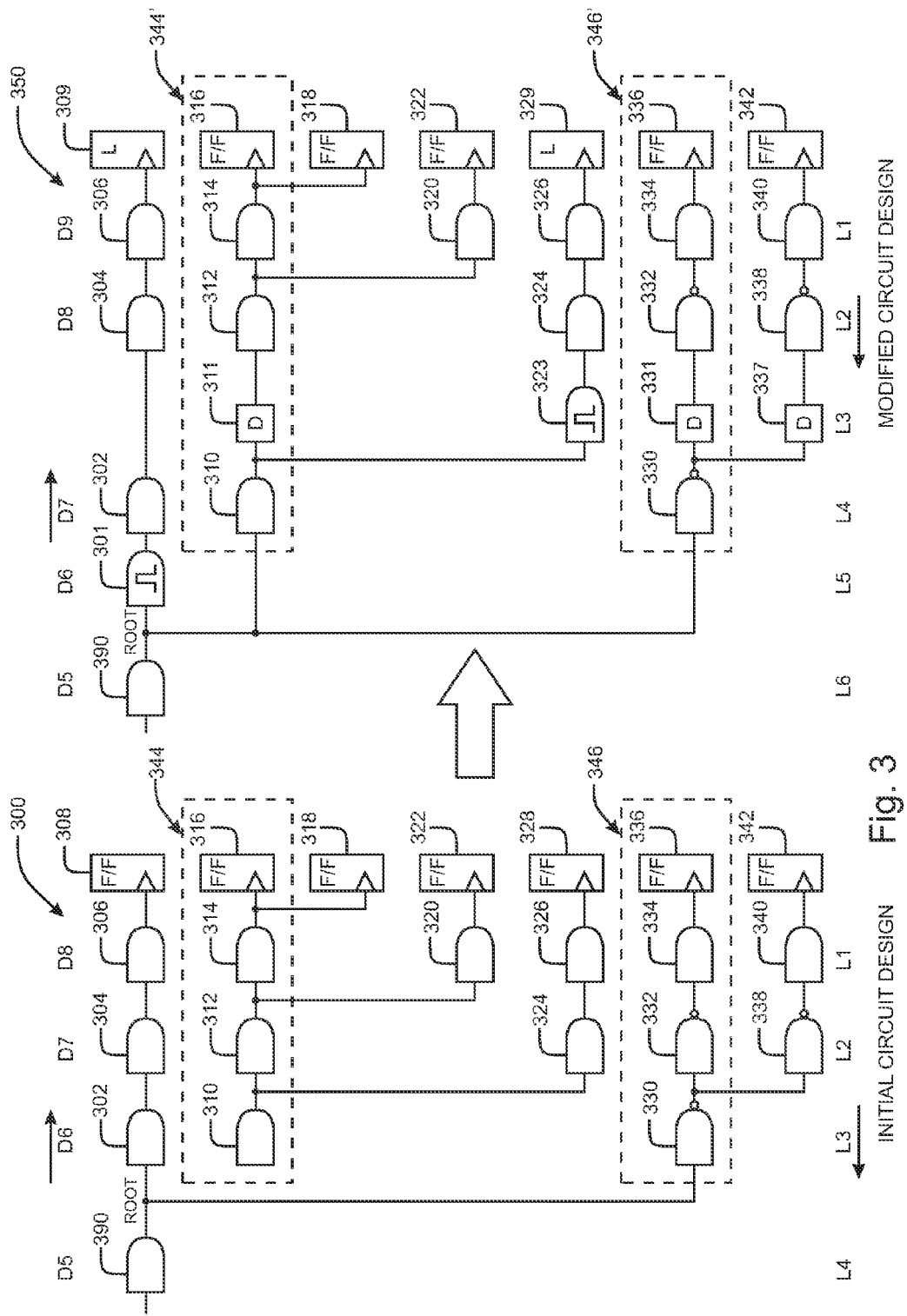
FIG. 3 illustrates a pair of block diagrams to compare an exemplary initial circuit design with an exemplary modified circuit design in accordance with another embodiment of the invention.

FIG. 3 illustrates a comparison block diagram of exemplary input circuit design 300 and modified circuit design 350 in accordance with another embodiment of the invention. In this example, the initial circuit design 300 comprises a clock network with three clock paths having a common root. The first clock path includes buffers 390, 302, 304, and 306 and edge-triggered flip-flop 308 connected in series. The second clock path includes clock buffers 390, 310, 312, 314, 320, 324, and 326, and flip-flops 318, 322, and 328. Clock buffers 310, 312, and 314 and flip-flop 316 are connected in series with flip-flop 316; flip-flop 318 is connected in parallel with flip-flop 316; clock buffer 320 and flip-flip 322 are connected in series off the node between clock buffers 312 and 314; and clock buffers 324 and 326, and flip-flop 328 are connected in series off the node between clock buffers 310 and 312. The third clock path includes clock buffer 390, inverters 330 and 332, clock buffer 334, and flip-flop 336 connected in series; and inverter 338, clock buffer 340, and flip-flop 342 connected in series off the node between inverters 330 and 332.

The clock tree synthesizer may forward trace each of the clock paths to the flip flops determine the depths of each clock buffer. For example, buffer 390 is at a depth of 5 (D5), buffer 302 is at a depth of six (D6), buffer 304 is at a depth of seven (D7), buffer 306 is at a depth of eight (D8). Buffers 310 and 330 are also at the depth of six. Buffers 312, 324, 342, and 339 are also at the depth of seven. Buffers 314, 320, 326, 334, and 340 are also at the depth of eight. The clock tree synthesizer may also backward trace each of the clock paths to determine the levels of each clock buffer. For example, buffer 306 is at a first level (L1), buffer 304 is at a second level (L2), buffer 302 is at a third level (L3), and buffer 390 is at a fourth level (L4). Buffers 314, 320, 326, 334, and 340 are also at the first level. Buffers 312, 324, 342, and 339 are also at the second level. Buffers 310 and 330 are also at the third level. The clock tree synthesizer may also forward and backward trace each of the clock paths to flip-flops to determine forbidden clock paths and to determine at what buffer level or levels to begin pulsed latch replacement analysis and insert a pulse generator.

The initial circuit design 300 further includes a pair of forbidden clock paths 344 and 346 as defined in the initial circuit design file. The first forbidden clock path includes clock buffers 310, 312, 314, and flip-flop 316. The second forbidden clock paths includes inverters 330 and 332, clock buffer 334, and flip-flop 336. The pair of forbidden clock paths 344, 346 may be the result of flip-flops 316, 336 being forbidden registers. As previously discussed, the forbidden clock paths 344 and 346 cannot be modified for the purpose of replacing the flip-flops 316 and 336 with respective pulsed latches. Additionally, there may be a constraint in the circuit design specification that pulse generators have to be located at the third level or higher of the clock network. Otherwise, adding pulse generators in lower levels (e.g., levels one (L1) and two (L2)) may result in too many pulse generators, which would themselves consume too much power.

Accordingly, in this example, flip-flops 318 and 322 are not eligible (i.e., forbidden) for pulsed latch replacement because providing pulse generators for the corresponding pulsed latches would violate the constraint that pulse generators cannot be located in level one (L1) (e.g., immediately preceding the pulsed latch) and level two (L2) (e.g., immediately preceding the clock buffer adjacent to the pulsed latch). Flip-flop 342 is also not eligible for pulsed latch replacement because it would either violate the pulse generator level constraint as discussed above if placed between inverter 338 and clock buffer 340, or situated in front of a device that generates a signal 180 degrees out of phase with the clock signal. In this example, a pulse generator added immediately before inverter 338 would violate the latter constraint. As discussed in more detail below, the initial circuit design 300 may be modified to make flip-flops 318, 322 and 342 eligible for pulsed latch replacement by cloning at least part of the forbidden clock networks 344 and 346.

Since, as discussed above, flip-flops 316, 318, 322, 336, and 342 are not eligible for the pulsed latch replacement, the processor 102 is able to apply pulsed latch replacement to flip-flops 308 and 328. Accordingly, the processor 102 modifies the initial circuit design 300 to generate the modified circuit design 350 as shown. In this example, the processor 102 has replaced flip-flop 308 with pulsed latch 309, and flip-flop 328 with pulsed latch 329. Additionally, the processor 102 has also added a pulse generator 301 in the clock path of pulsed latch 309. The processor 102 also added a pulsed generator 323 in the clock path of pulsed latch 329.

The added pulse generators 301 and 323 may have affected the timing of their respective clock paths because of its inherent delay. In such a case, the clock paths of pulse generators 301 and 323 may not be in time with the remaining clock paths in the clock network. In order to balance the timing of the clock network, delay cells may be added at the buffer level of pulse generation insertion to the remaining clock paths to the in-eligible flip-flops. Accordingly, the processor 102 further modifies the initial circuit design 300 to add a delay cell 311 for the path to flip-flops 316, 318 beginning with clock buffer 312, a delay cell 331 for the clock path to the flip-flop 336 beginning with inverter 332, and a delay cell 337 for the clock path to the flip-flop 342 beginning with inverter 338. Since, in this example, the modified circuit design 350 has two pulsed latches 309 and 329 instead of flip-flops 308 and 328 of the initial circuit design 300, the modified circuit design 350 can consume less dynamic power than the initial circuit design 300.

Figure 4:
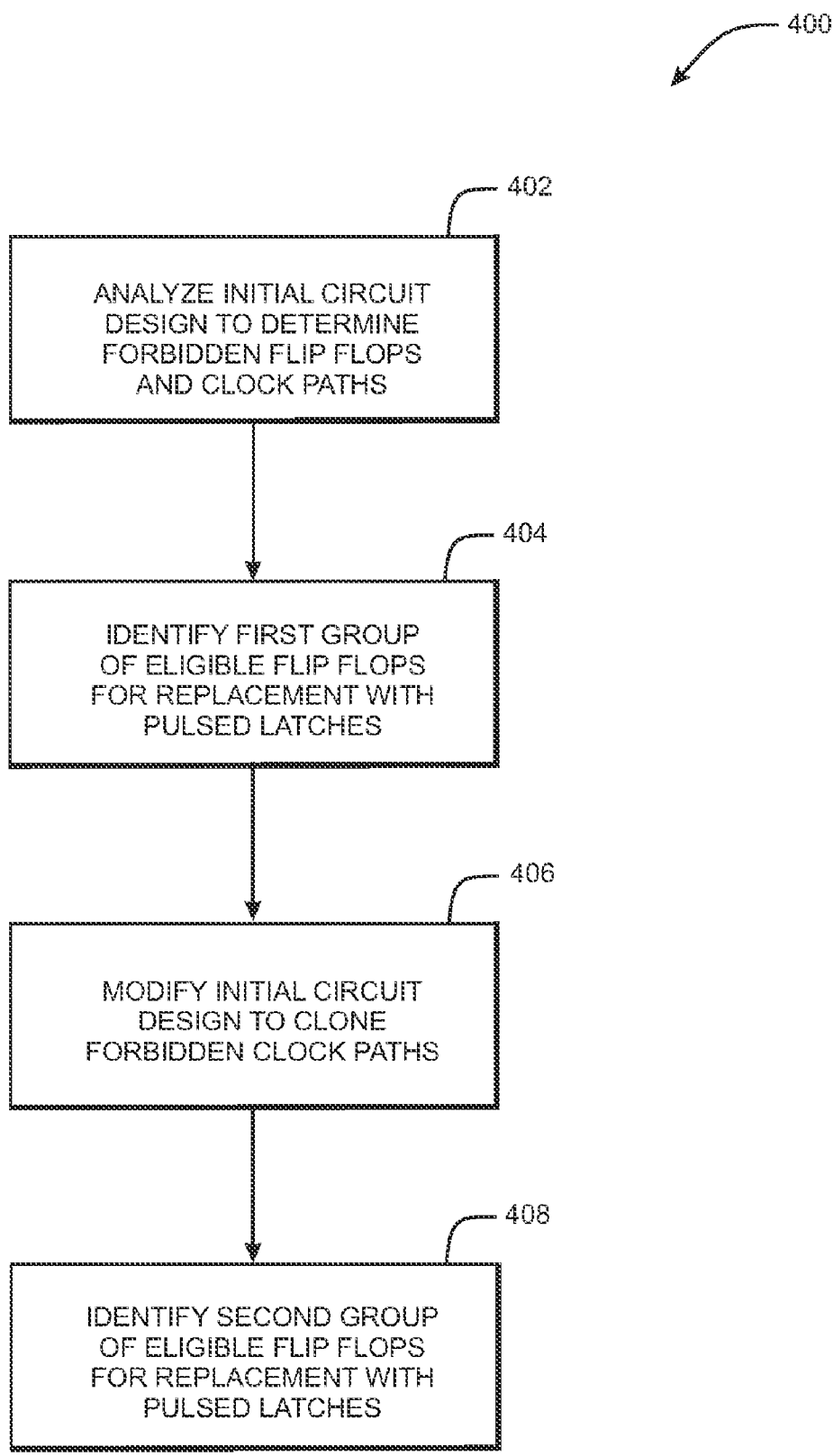
FIG. 4 illustrates a flow diagram of an exemplary method of identifying candidate edge-triggered flip-flops for replacement with pulsed latches in accordance with another embodiment of the invention.

FIG. 4 illustrates a flow diagram of an exemplary method 400 of identifying candidate edge-triggered flip-flops for replacement with pulsed latches in accordance with another embodiment of the invention. This method 400 may be a particular example of identifying candidate flip-flops as specified in block 204 of the method 200. According to the method 400, the processor 102 analyzes the initial circuit design to determine forbidden flip flops and corresponding clock paths (block 402). Again, a user using the user interface 106 may provide the processor 102 with the specification identifying forbidden flip flops, and the minimum level to which pulse generators could be added. Using the initial circuit design 300 in FIG. 3 as an example, the processor 102 identifies flip-flops 316, 318, 322, 336, and 342 as forbidden flip-flops.

After the forbidden flip-flops are identified, the processor 102 identifies the remaining flip-flops as the first group of eligible flip-flops for pulsed latch replacement (block 404). The processor 102 then modifies the initial circuit design to clone at least a portion of forbidden clock paths in order to remove connections to forbidden clock paths. This would further increase the number of flip-flips that would be eligible for pulsed latch replacement. This is better explained below with reference to FIGS. 5 and 6. Then, the processor 102 identifies the flip-flops affected by the cloning of forbidden clock paths as the second group of flip-flops eligible for pulsed latch replacement (block 408). Accordingly, the processor 102 identifies the flip-flops of both first and second groups as the flip-flops eligible for pulsed latch replacement.

Figure 5:
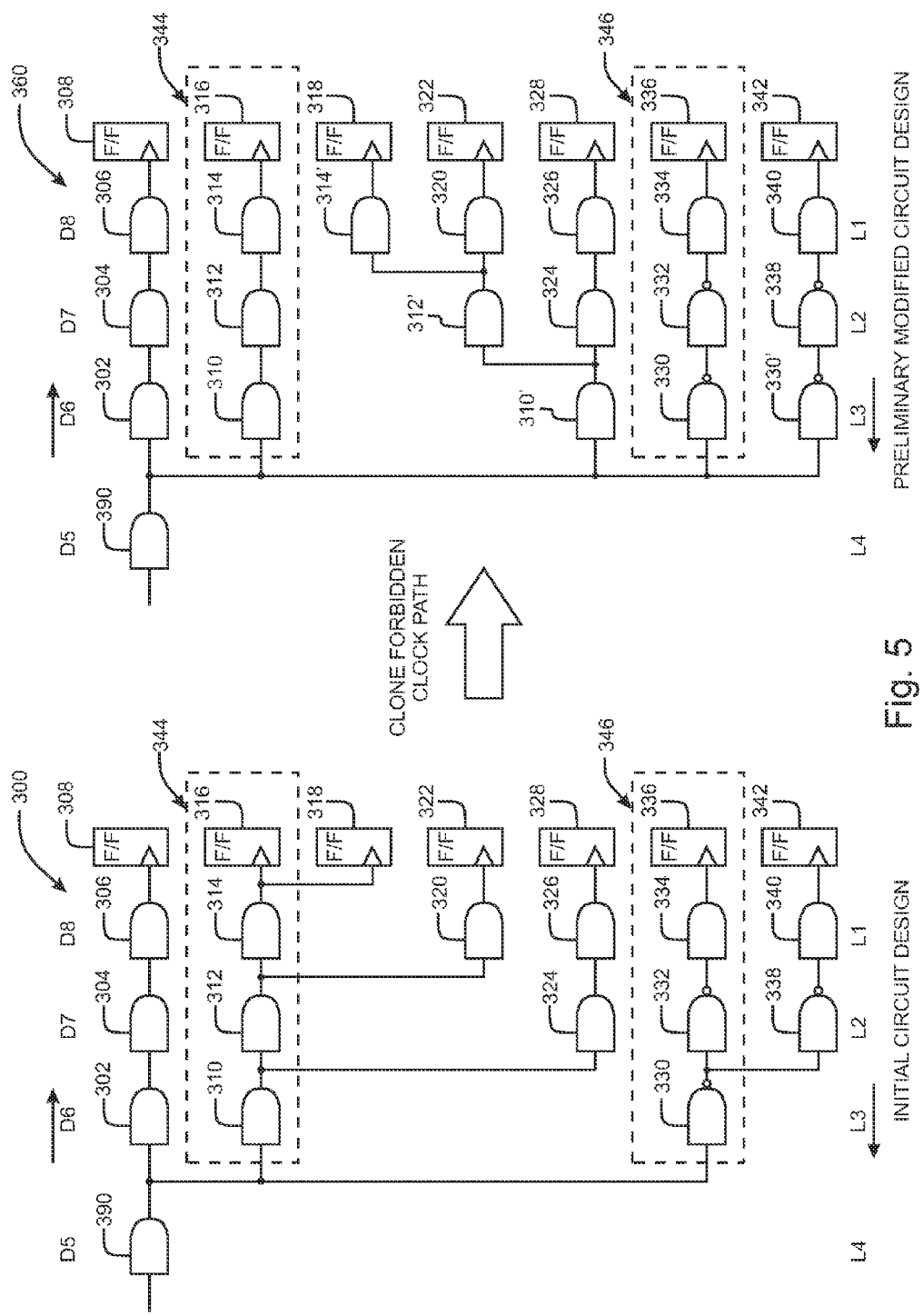
FIG. 5 illustrates a pair of block diagrams to compare an exemplary initial circuit design with an exemplary preliminary modified circuit design that has undergone forbidden clock cloning in accordance with another embodiment of the invention.

FIG. 5 illustrates a comparison block diagram of exemplary initial circuit design 300, and modified circuit design 360 that has undergone forbidden clock cloning in accordance with another embodiment of the invention. In this example, the initial circuit design 300 is the same one that was previously discussed with reference to FIG. 3. In that prior example, two (2) out of seven (7) flip-flops were identified as being eligible for pulsed latch replacement. As shown below, using forbidden clock cloning techniques, the number of eligible flip-flops identified is five (5), a significant increase of eligible flip-flops.

According to the forbidden clock cloning technique, the processor 102 modifies the initial circuit design 300 to clone the forbidden clock path 344 consisting of clock buffers 310, 312 and 314 with clock path consisting of cloned clock buffers 310', 312', and 314'. The processor 102 further modifies the initial circuit design 300 in a manner that the otherwise-forbidden flip-flops 318, 322, and 328 are connected to the cloned clock path instead of the forbidden clock path. Thus, flip-flop 320 is connected to the output of cloned clock buffer 314', flip-flop 322 is coupled to the output of cloned clock buffer 312' via clock buffer 320, and flip-flop 328 is coupled to the output of cloned clock buffer 310' via clock buffers 324 and 326.

Similarly, the processor 102 modifies the initial circuit design 300 to clone a portion of forbidden clock path 346, namely inverter 330, with inverter 330'. The processor 102 modifies the initial circuit design 300 in a manner that flip-flop 342 is coupled to the output of cloned inverter 330' instead of the output of inverter 330 in the forbidden clock path. As a result, the modified circuit design 360 includes five (5) flip-flops 308, 318, 322, 328, and 342 that are not connected to forbidden clock paths. Accordingly, these flip-flops are now eligible for pulsed latch replacement.

Figure 6:
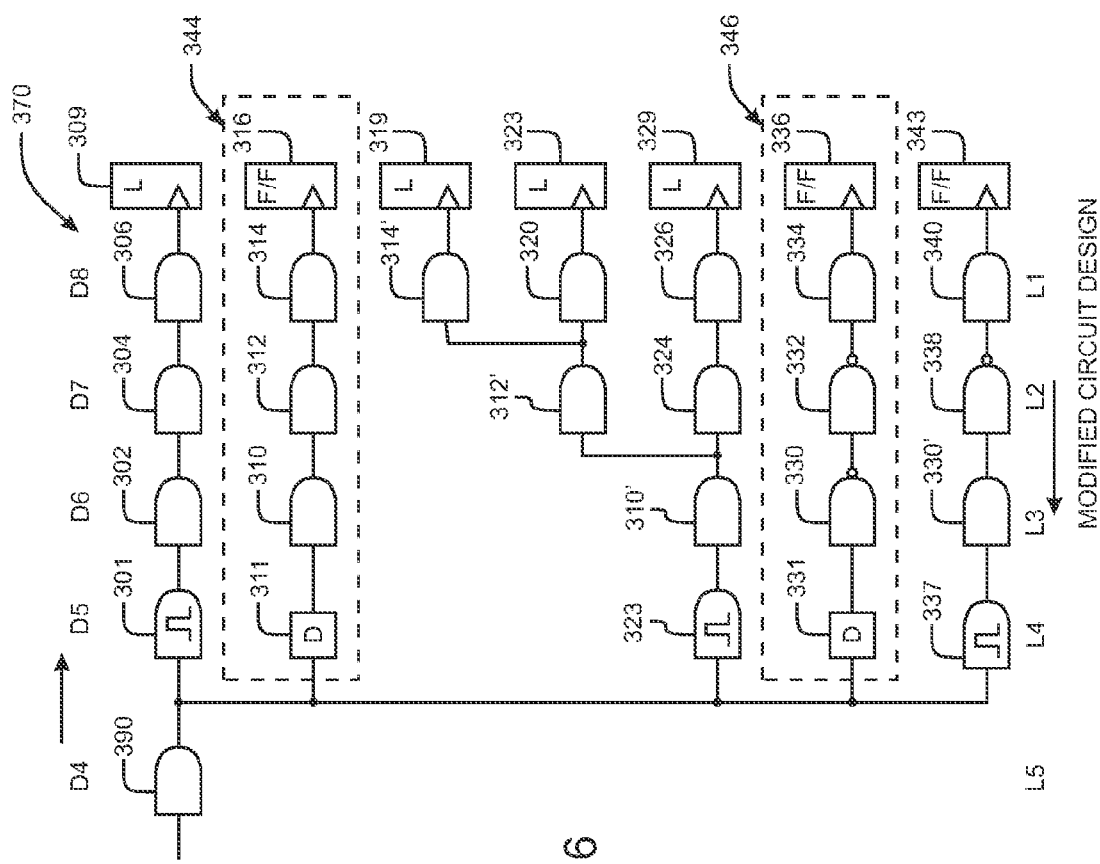
FIG. 6 illustrates a block diagram of an exemplary modified circuit design associated with the preliminary modified circuit design of FIG. 5 in accordance with another embodiment of the invention.

FIG. 6 illustrates a block diagram of a modified circuit design 370 in accordance with another embodiment of the invention. The processor 102 now operates on the modified circuit design 360 to perform the pulsed latch replacement. In this regard, the processor 102 modifies the circuit design 360 to replace the flip-flops 308, 318, 322, 328, and 342 with pulsed latches 309, 319, 323, 329, and 343, respectively. Also, the processor 102 further modifies the circuit design 360 to add pulse generators 301 at root of clock path of pulsed latch 309, a pulse generator 323 at root of clock path of pulsed latches 319, 323, and 329, and pulse generator 337 at root of clock path of pulsed latch 343. Additionally, the processor 102 further modifies the circuit design 360 to add delay cells 311 and 331 to the forbidden clock paths 344 and 346 in order to balance the timing in the clock network. These modifications result in the modified circuit design 370.

The clock tree synthesizer may generate a clock tree for the initial integrated circuit with an aggressive initial slew rate, such as 100 pico-seconds (ps) for example, that will assure functionality of the pulse generators and the pulsed latches. After the pulsed latch replacement, the pulse generator insertion and delay timing balancing, the skew, slew, and timing in the modified integrated circuit should be re-evaluated and improved to be sure the pulsed latches will properly operate in place of the flip flops and to conserve power.

Figure 7:
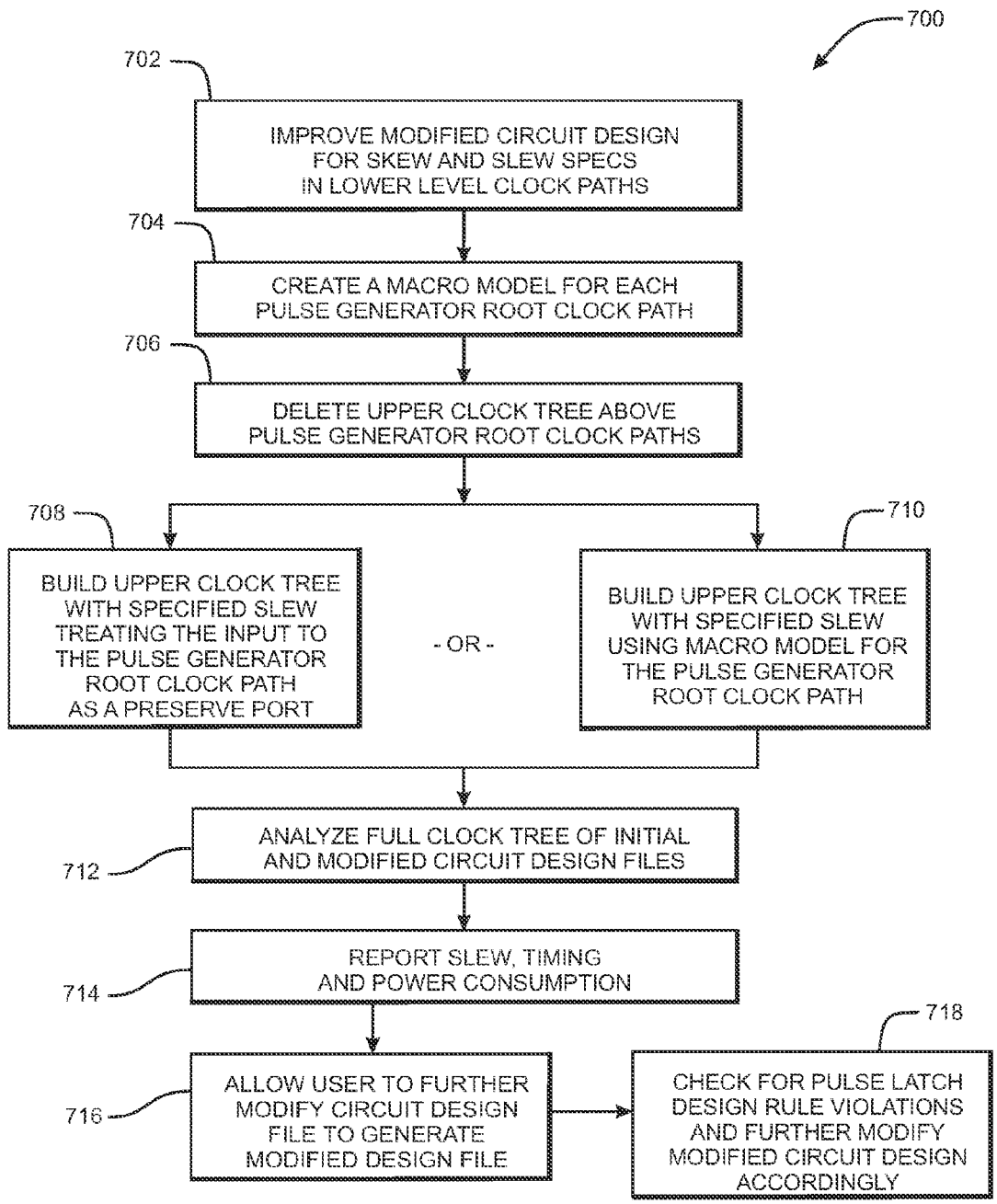
FIG. 7 illustrates a flow diagram of an exemplary method of improving the modified circuit design for skew, slew, power, and other considerations in accordance with another embodiment of the invention.

FIG. 7 illustrates a flow diagram of an exemplary method 700 of improving the modified circuit design 370 for skew, slew, power, timing and other parameters in accordance with another embodiment of the invention. Once the processor 102 has modified the initial circuit design 300 to generate the modified circuit design 370, the processor 102 may perform further optimization, synthesis, and analyses on the modified circuit design 370. The exemplary method 700 may be one particular example of further optimizing, synthesizing, and analyzing the modified circuit design 370.

According to the method 700, the processor 102 analyzes the modified circuit design 370 to improve the skew and slew parameters in lower level clock paths (block 702). These lower level paths include paths that have pulse generators at their respective roots that generate a narrow pulse to clock a pulsed latch. The skew (i.e., delay time) and slew (i.e., rise time and fall time) in the lower level clock paths should be considered to generate the pulses at the pulse generator and maintain the proper operation of the pulsed latches that replace flip-flops. The processor 102 may then create a macro model of each pulse generator root clock path (block 704) in one embodiment of the invention. The processor 706 may then delete the existing upper clock tree; that is, the clock tree above the pulse generator root clock paths (block 706).

After deleting the upper clock tree, the processor 102 can either re-build the upper clock tree in at least two different manners. For example, in one embodiment of the invention, the processor 102 can re-build the upper clock tree with a specified slew rate that is more relaxed to conserve power while treating the input of each pulse generator root clock path as a preserve port (block 708) to maintain the initial slew rate, skew rate, and timing in the lower level clock paths that had assured functionality. In another embodiment of the invention, the processor 102 can also re-build the upper clock tree with the specified slew that is more relaxed to conserve power while using a macro model for each pulse generator root clock path (block 710). This is better explained with reference to the examples shown in FIGS. 8A and 8B.

FIG. 8A illustrates the case of building the upper clock tree while treating the input to each pulse generator root clock path as a preserve port. According to this case, the processor 102 first builds the initial circuit design 300 using a clock tree to clock flip-flops with a slew specification of no more than 100 picoseconds (ps), as shown in the upper diagram. The processor 102 then builds the modified circuit design 370 by performing the pulsed latch swapping and pulse generator insertion as previously discussed, as shown in the middle diagram. The processor 102 then optimizes the modified circuit design 370 so that the slew of the lower level clock paths are within their specification (e.g., <100 ps), as shown in the lower diagram. The processor 102 then deletes and re-builds the upper clock tree so that its slew is within its more relaxed specification (e.g., <350 ps), while treating the inputs to the pulse generator root clock paths as preserve ports, maintaining their more aggressive slew rate, as shown in the lower diagram.

Figure 8B:
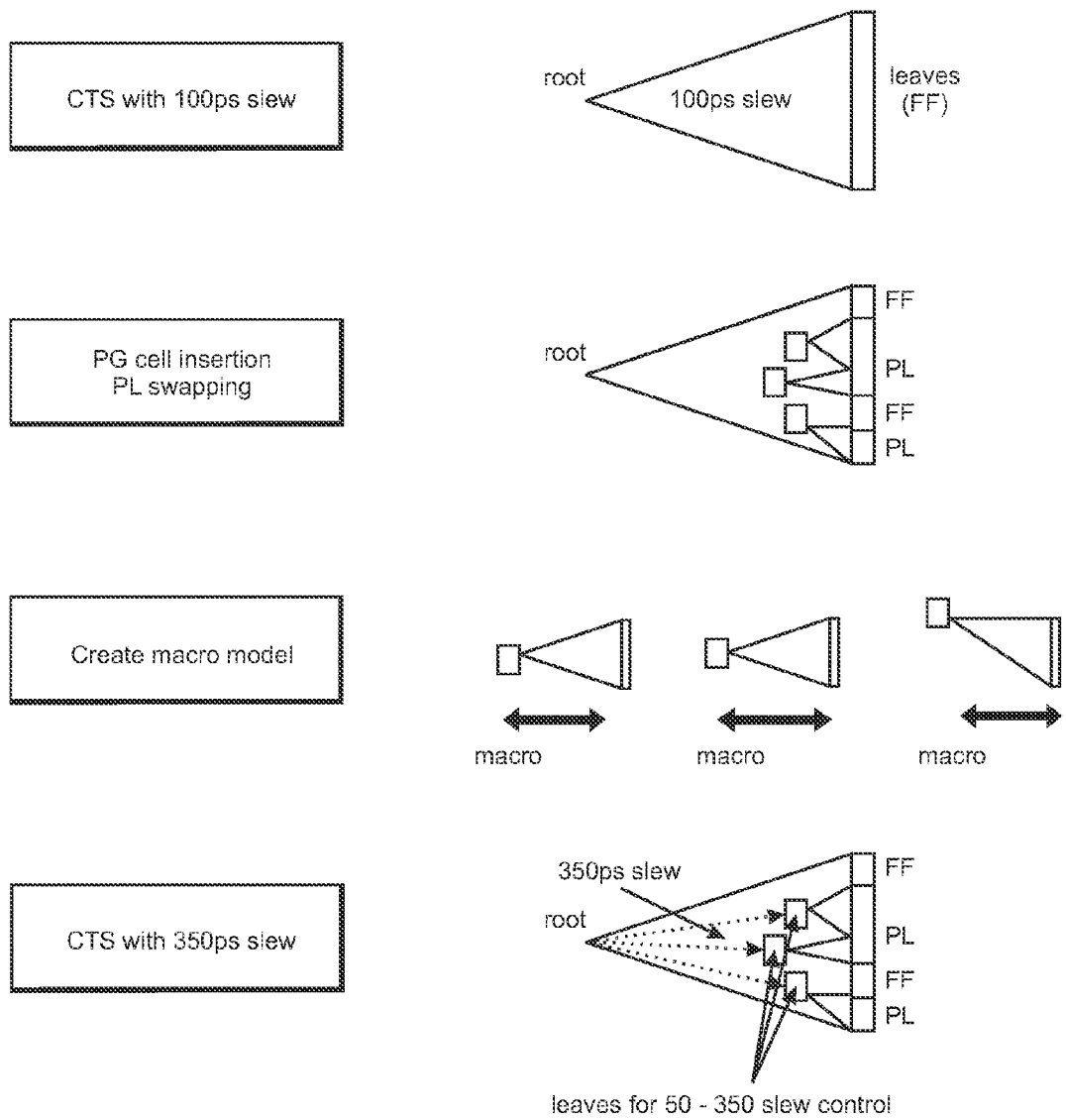

FIG. 8B illustrates the case of building the upper clock tree while using a macro model for each pulse generator root clock path. According to this case, the processor 102 first builds the initial circuit design 300 using a clock tree to clock flip-flops with a slew specification of no more than 100 picoseconds (ps), as shown in the upper diagram. The processor 102 then builds the modified circuit design 370 by performing the pulse latch swapping and pulse generator insertion as previously discussed, as shown in the second diagram. The processor 102 then creates macro models for the pulse generator root clock paths and optimizes their slew so that they are within their specification (e.g., 50-350 ps), as shown in the third and fourth diagrams. The processor 102 then deletes and re-builds the upper clock tree so that its slew is within its specification (e.g., <350 ps), while using a macro model for each pulse generator root clock paths, as shown in the fourth diagram. The use of the macro-model for the lower level clock paths is more flexible with respect to timing specifications and may speed up the overall timing analysis of the clock tree while maintaining their specified slew rate timing.

Referring now back to FIG. 7, after the processor 102 has rebuilt and optimized the upper clock tree in accordance with blocks 708 or 710, the processor 102 analyzes the entire clock tree of the initial and modified circuit designs for comparison reporting purposes (block 712). The processor 102 then reports out, via the user interface 106, the slew, timing and power consumption for both the initial circuit design and the modified circuit design (block 714). This allows the user to compare the results and further modify the modified circuit design for trade-off purposes (block 716). The processor 102 then checks the modified circuit design for pulsed latch design rule violations (block 718). Such violations may include clock network worse-case slew outside of minimum and maximum slew limits; multiple pulse generators and/or multiple delay cells in same clock path; performing pulsed latch swapping of forbidden flip-flops; and pulsed latches not driven by pulse generators.

Figure 9:
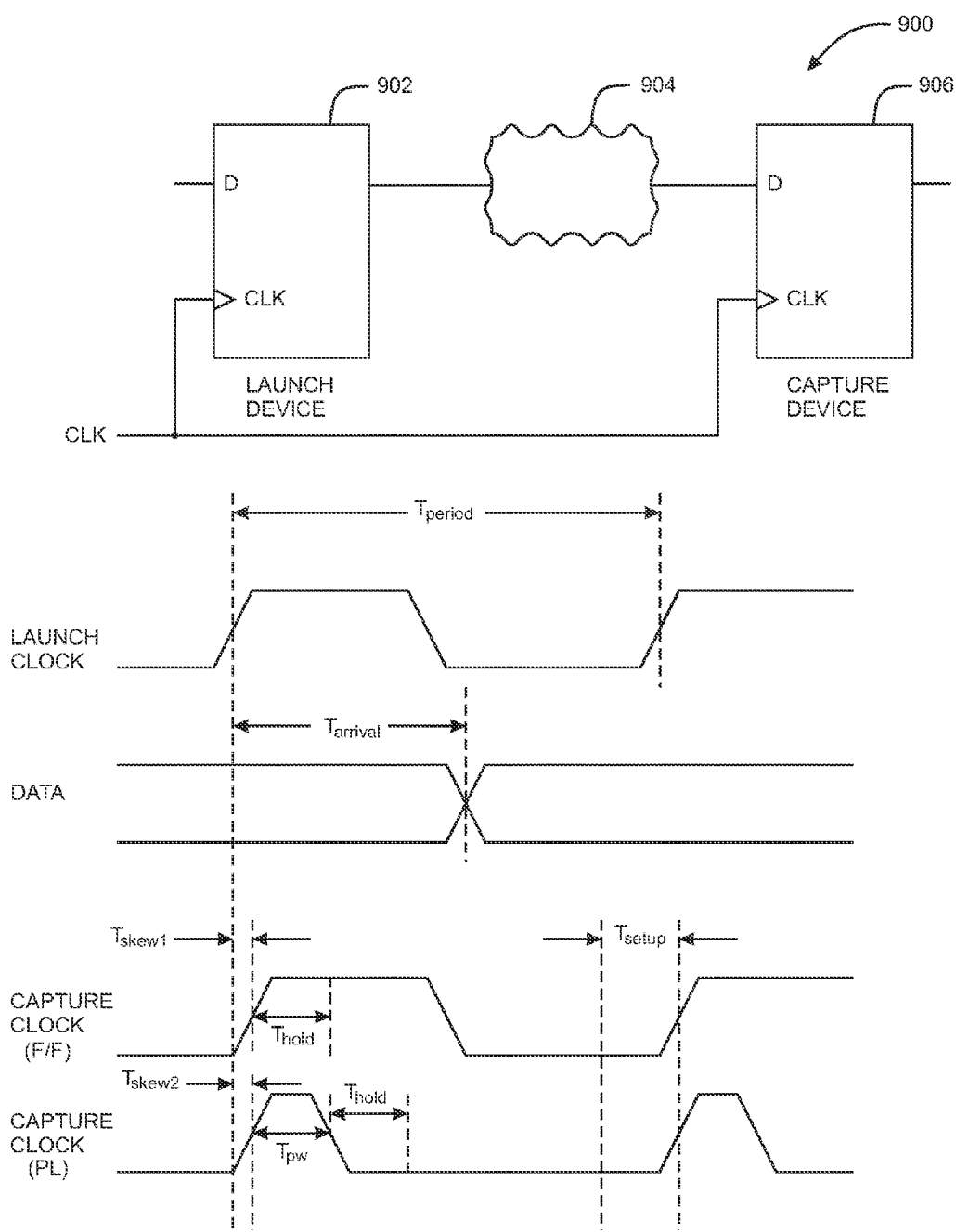
FIG. 9 illustrates a diagram for illustrating a comparison of the timing analyses for a flip-flop and a pulsed latch in accordance with another embodiment of the invention.

FIG. 9 illustrates a diagram for illustrating a comparison of the timing analyses for a flip-flop and a pulsed latch in accordance with another embodiment of the invention. In the upper portion of the diagram, an exemplary circuit 900 is shown comprising a launch device 902, logic 904, and a capture device 906. A clock signal is routed to the respective clock inputs of the launch device 902 and the capture device 906. For timing analysis comparison purpose, in one scenario, the launch and capture devices 902 and 906 are flip-flops, and in another scenario, the devices 902 and 906 are pulsed latches.

The lower portion of the figure illustrates a timing diagram for the clock signal at the clock input of the launch device 902 (the "launch clock"), a timing diagram of the data propagating from the launch device 902 to the capture device 906, a timing diagram of the clock signal at the clock input of the capture device 906 in the scenario that the devices 902 and 906 are flip-flops (the "capture clock (F/F)"), and a timing diagram of the clock signal at the clock input of the capture device 906 in the scenario that the devices 902 and 906 are pulsed latches (the "capture clock (PL)"). In the case where the devices 902 and 906 are pulsed latches, a pulse generator is used to generate the clock signal in response to a primary clock signal as discussed above.

As shown in the launch clock timing diagram, the period of launch clock signal is Tperiod, and can be defined herein as the time from a clock positive edge to the next positive edge. As shown in the data timing diagram, the time in which data propagates from the input of the launch device 902 to the input of the capture device 906 in response to the launch clock positive edge can be defined as Tdata_arrival. As shown in the capture clock diagrams, the clock skew Tskew can be defined as the time difference between the capture clock and the launch clock. The clock skew for the flip-flop scenario, defined herein as Tskew1, may be different than the clock skew for the pulsed latch scenario, defined herein as Tskew2. For instance, Tskew2 may be greater than Tskew1 because of the additional delay introduced by the pulse generator. The setup time Tsetup can be defined as the time prior to the clock positive edge in which data needs to arrive at the input of the capture device 906 so that it can capture the data. And, the hold time Thold can defined as the time after the clock positive edge that the data at the input of the launch device 902 needs to be held so that the device 902 can capture the data.

The timing analysis of the setup time Tsetup for both scenarios is substantially the same. For both cases, the setup time Tsetup is a time window prior to a clock positive edge in which data needs to arrive at the input of a device for the device to capture it. The setup slack time Tsetup_slack can be defined as follows:

$$Tsetup\_slack = Tperiod - Tskew - Tsetup - Tdata\_arrival \qquad \text{Eq. 1}$$

The required setup time Tsetup_required may be defined as follows:

$$Tsetup\_required = Tperiod - Tskew - Tsetup \qquad \text{Eq. 2}$$

Combining equations 1 and 2, the following relationship holds for the setup slack time Tsetup_slack:

$$Tsetup\_slack = Tsetup\_required - Tdata\_arrival \qquad \text{Eq. 3}$$

If the setup slack time Tsetup_slack is positive (e.g., Tslack_required>Tarrival), it means that the data path met timing and the circuit can function as specified. If the setup slack time Tsetup_slack is negative (e.g., Tslack_required<Tarrival), it means that the data path did not meet timing and further analysis, synthesis, and/or optimization may be needed.

The timing analysis of the hold time Thold for the flip-flop scenario may be different than that for the pulsed latch. In the case of the flip-flop, the hold time Thold can be defined as the time the data needs to be held at the input of a device after the clock positive edge. The hold slack time Thold_slack can be defined as follows:

$$Thold\_slack = Tdata\_arrival - Tskew1 - Thold \qquad \text{Eq. 4}$$

The required hold time Thold_required may be defined as follows:

$$Thold\_required = Tskew1 - Thold \qquad \text{Eq. 5}$$

Combining equations 4 and 5, the following relationship holds for the hold slack time Thold_slack:

$$Thold\_slack = Tdata\_arrival - Thold\_required \qquad \text{Eq. 6}$$

If the hold slack time Thold_slack is positive (e.g., Tdata_arrival>Thold_required), it means that the data path met timing and the circuit can function as specified. If the hold slack time Thold_slack is negative (e.g., Tdata_arrival<Tarrival), it means that the data path did not meet timing and further analysis, synthesis, and/or optimization may be needed.

In the case of pulsed latch, the hold time Thold can be defined as the time the data needs to be held at the input of a device after the clock negative edge. The pulse width of the pulse generated by a pulse generator may be defined herein as Tpw. The hold slack time Thold_slack can be defined as follows:

$$Thold\_slack = Tdata\_arrival - Tskew2 - Tpw - Thold \qquad \text{Eq. 7}$$

The required hold time Thold_required may be defined as follows:

$$Thold\_required = Tskew2 - Tpw - Thold \qquad \text{Eq. 8}$$

Combining equations 7 and 8, the following relationship holds for the hold slack time Thold_slack:

$$Thold\_slack = Tdata\_arrival - Thold\_required \qquad \text{Eq. 9}$$

If the hold slack time Thold_slack is positive (e.g., Tdata_arrival>Thold_required), it means that the data path met timing and the circuit can function as specified. If the hold slack time Thold_slack is negative (e.g., Tdata_arrival <Tarrival), it means that the data path did not meet timing and further analysis, synthesis, and/or optimization may be needed.

Thus, in the pulsed latch scenario, the required hold time is typically larger than the required hold time for the flip-flop scenario. This is because of the extra parameter of the pulse width Tpw of signal generated by the pulse generator. If the pulse width Tpw is wide, it may be more difficult for the data path to meet timing. While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A method of designing an integrated circuit with a circuit design system, the method comprising:
  with a processor,
    analyzing clock paths in a clock network of an integrated circuit design, the integrated circuit design including a plurality of flip-flops coupled to the clock paths of the clock network;
    selectively replacing one or more of the plurality of flip-flops in the integrated circuit design with pulsed latches to lower power consumption, the pulsed latches to store information; and
    adding pulse generators in clock paths to the pulsed latches, the pulse generators to clock the pulsed latches.

2. The method of claim 1, further comprising
  adding delay cells to clock paths without pulse generators, the delay cells to compensate for timing effects in the clock network caused by the pulse generators.

3. The method of claim 1, wherein
  the plurality of flip-flops comprises edge-triggered flip-flops.

4. The method of claim 1, further comprising:
  prior to selectively replacing the flip-flops, identifying eligible flip-flops in the integrated circuit design for replacement.

5. The method of claim 4, wherein
  identifying the eligible flip-flops in the integrated circuit design for replacement comprises:
    identifying the forbidden flip-flops in the integrated circuit design;
    modifying the integrated circuit design so that selected forbidden flip-flops are eligible for pulsed latch replacement; and
    identifying the selected forbidden flip-flops as eligible flip-flops.

6. The method of claim 5, wherein
  modifying the integrated circuit design so that selected forbidden flip-flops are eligible for pulsed latch replacement includes
    modifying the integrated circuit design to add a clock path which is a clone of at least a portion of a forbidden clock path containing at least one of the forbidden flip-flops; and
    modifying the integrated circuit design so that one or more of the forbidden flip-flops are connected to the cloned clock path instead of the forbidden clock path.

7. The method of claim 1, further comprising:
  modifying the integrated circuit design to improve skew and/or slew parameters of clock paths including the pulse generators.

8. The method of claim 7, wherein
  modifying the integrated circuit design includes
    treating inputs to the pulse generators as preserve ports.

9. The method of claim 7, further comprising:
  generating macro models of lower clock paths including the pulse generators.

10. The method of claim 9, wherein
  modifying the circuit design further includes
    using the macro models of the lower clock paths including the pulse generators to evaluate the overall slew rate of the clock tree.

11. The method of claim 7, further comprising:
  modifying the integrated circuit design in response to inputs received from a user.

12. The method of claim 1, further comprising:
  analyzing the integrated circuit design to determine if there is any violation of one or more pulsed latch design rules.

13. The method of claim 12, wherein
  the pulsed latch design rules comprise any one or more of the following:
    slew rate of the clock network is to be within minimum and maximum slew limits;
    no multiple pulse generators and/or multiple delay cells are to be in the same clock path;
    no replacing of a forbidden flip-flop with a pulsed latch; and
    a pulsed latch is not to be driven by a pulse generator.

* * * * *